US 6,531,259 B1
United States Patent
Kishimura et al.

(10) Patent No.: US 6,531,259 B1
(45) Date of Patent: Mar. 11, 2003

(54) PATTERN FORMATION METHOD AND PATTERN FORMATION MATERIAL (75) Inventors: Shinji Kishimura, Hyogo (JP); Akiko Katsuyama, Kyoto (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/592,937

(22) Filed: Jun. 13, 2000

(30) Foreign Application Priority Data

Jun. 21, 1999 (JP) ............................. 11-174202

(51) Int. Cl.$^7$ ............................. G03F 7/004
(52) U.S. Cl. .................... 430/270.1; 430/326; 430/905; 430/910
(58) Field of Search ................ 430/270.1, 326, 430/905, 910

(56) References Cited

U.S. PATENT DOCUMENTS

| 5,506,088 A | | 4/1996 | Nozaki et al. ............ 430/270.1 |
| 5,556,734 A | * | 9/1996 | Yamachika et al. ....... 430/270.1 |
| 5,558,971 A | * | 9/1996 | Urano et al. ................ 430/170 |
| 5,863,699 A | | 1/1999 | Asakawa et al. ......... 430/270.1 |
| 5,908,732 A | | 6/1999 | Aviram et al. .............. 730/296 |
| 6,150,068 A | * | 11/2000 | Sato et al. ............... 430/270.1 |
| 6,280,908 B1 | * | 8/2001 | Aviram et al. .............. 430/314 |

FOREIGN PATENT DOCUMENTS

| EP | 0 780 732 | | 6/1997 |
| EP | 0 824 223 | | 2/1998 |
| EP | 0 875 787 | | 11/1998 |
| EP | 0 704 762 | | 4/1999 |
| EP | 1 035 441 | | 9/2000 |
| JP | 58114033 | * | 7/1983 |
| JP | 02-248952 | | 10/1990 |
| JP | 03-223861 | | 10/1991 |
| JP | 7077799 | * | 3/1995 |
| JP | 10-186665 | | 7/1998 |
| JP | 10319596 | * | 12/1998 |
| JP | 11-231536 | | 8/1999 |
| JP | 11-231537 | | 8/1999 |

OTHER PUBLICATIONS

CA abstract JP 7077799, Mar. 1995.*
CA abstract JP 10319596, Dec. 1998.*
CA abstract JP 58114033, Jul. 1983.*
European Search Report, Nov. 14, 2000, 6 pages.
Patent Abstracts of Japan, JP 56–0369539, Published Apr. 15, 1981.
*Approach for VUV Positive Resists Using Photodecomposable Polymers*, Shinji Kishimura et al., Proceedings of SPIE Reprint, Reprinted From: Advances in Resist Technology and Processing XVII, Feb. 28–Mar. 1, 2000, Santa Clara, USA, vol. 3999, pp. 347–356.

* cited by examiner

Primary Examiner—Rosemary Ashton
(74) Attorney, Agent, or Firm—Nixon Peabody LLP; Donald R. Studebaker (57) ABSTRACT

The pattern formation material of this invention includes a base polymer having a unit represented by the following General Formula 1:

General Formula 1:

$$\left(\begin{array}{c} R_3 \\ | \\ -C- \\ | \\ R_4 \end{array} \begin{array}{c} R_0 \\ | \\ C- \\ | \\ R_1 \end{array}\right)$$

wherein $R_0$ is an alkyl group; $R_1$ is a group that is decomposed through irradiation of light; and $R_3$ and $R_4$ are the same or different and selected from the group consisting of hydrogen and compounds including hydrogen and carbon.

37 Claims, 2 Drawing Sheets

PATTERN FORMATION METHOD AND PATTERN FORMATION MATERIAL

BACKGROUND OF THE INVENTION

The present invention relates to a pattern formation method for forming a resist pattern by irradiating a resist film with exposing light of a wavelength of a 1 through 30 nm band or a 110 through 180 nm band, and a pattern formation material to be used in the same.

Currently, in fabrication of a large scale semiconductor integrated circuit, such as a 64 Mbit dynamic random access memory (DRAM), a logic device with a 0.25 μm through 0.18 μm rule and a system LSI including such a memory and a device, a resist pattern is formed by subjecting a chemically amplified resist including a polyhydroxystyrene derivative and an acid generator to pattern exposure using KrF excimer laser (of a wavelength of a 248 nm band).

Moreover, for fabrication of a large scale integrated circuit, such as a 256 Mbit DRAM and a 1 Gbit DRAM with a 0.15 μm through 0.13 μm rule and a system LSI including such a memory, a pattern formation method using, as exposing light, ArF excimer laser operated at a shorter wavelength (of a 193 nm band) than the KrF excimer laser is now under development.

In the chemically amplified resist including a polyhydroxystyrene derivative used in employing the KrF excimer laser, however, an aromatic ring included in the polyhydroxystyrene derivative has such high absorbance against light of a wavelength of a 193 nm band that the exposing light cannot uniformly reach the bottom of a resist film. Therefore, this chemically amplified resist cannot be suitably used when the ArF excimer laser is employed.

Therefore, a chemically amplified resist including a polyacrylic acid derivative having no aromatic ring is being studied as a resist to be used in employing the ArF excimer laser.

In order to form a pattern finer than 0.13 μm, however, it is necessary to use exposing light of a wavelength of a 1 through 180 nm band, namely, a wavelength shorter than that of the ArF excimer laser, such as $Xe_2$ excimer laser (of a wavelength of a 172 nm band), $F_2$ excimer laser (of a wavelength of a 157 nm band), $Kr_2$ excimer laser (of a wavelength of a 146 nm band), ArKr excimer laser (of a wavelength of a 134 nm band), $Ar_2$ excimer laser (of a wavelength of a 126 nm band) or soft-X rays (of a wavelength of a 13 nm, 11 nm or 5 nm band).

Therefore, the present inventors have formed resist patterns by conducting pattern exposure, using exposing light of a wavelength of a 1 through 180 nm band such as $F_2$ excimer laser, on resist films of known resist materials, specifically, a resist material including a polyhydroxystyrene derivative represented by Chemical Formula 1 and a resist material including a polyacrylic acid derivative.

Chemical Formula 1:

As a result, the resist pattern cannot be formed in a good pattern shape with a rectangular section and much scum (residue) remains on a substrate.

Accordingly, the conventional resist materials, namely, the resist materials used in employing KrF excimer laser or ArF excimer laser, cannot be used in a pattern formation method using exposing light of a wavelength of a 1 through 30 nm band or a 110 through 180 nm band.

SUMMARY OF THE INVENTION

In consideration of the aforementioned conventional problem, an object of the invention is providing a pattern formation material and a pattern formation method for obtaining a resist pattern in a good shape by using exposing light of a wavelength of a 1 through 30 nm band or a 110 through 180 nm band.

In order to achieve the object, the present inventors have variously examined the reason why a resist pattern has a defective sectional shape when formed from a conventional resist material, such as a resist material including a polyhydroxystyrene derivative as a main component, through pattern exposure using exposing light of a wavelength of a 1 through 180 nm band, resulting in finding the following: Since the exposing light of a wavelength of a 1 through 180 nm band has high energy, the polyhydroxystyrene derivative, that is, the main component of the resist material, is directly reacted with the exposing light. Therefore, hydrogen bonded to carbon located at the α-position and constituting the main chain of the resist material is eliminated, so as to cause a crosslinking reaction for bonding polymer radicals from which hydrogen has been eliminated, which degrades the solubility of an exposed portion of the resist film in a developer.

Therefore, the inventors have variously studied on means for preventing the crosslinking reaction of the main chain of the resist material. As a result, it has been found that the crosslinking reaction of the main chain can be prevented by substituting an alkyl group for a hydrogen atom bonded to carbon located at the α-position and constituting the main chain.

Furthermore, when an alkyl group is substituted for the hydrogen atom bonded to carbon located at the α-position and constituting the main chain of the resist film, the main chain decomposes in an exposed portion of the resist film in development of the resist film with an alkaline developer. Moreover, it has been found that since the solubility of the exposed portion of the resist film in an alkaline developer can be thus improved, the dissolution contrast between an exposed portion and an unexposed portion can be improved so as to attain high resolution. The present invention was devised on the basis of these findings.

The first pattern formation material of this invention comprises a base polymer including a unit represented by the following General Formula 1:

General Formula 1:

wherein $R_0$ is an alkyl group; $R_1$ is a group that is decomposed through irradiation of light; $R_3$ and $R_4$ are the same or different and selected from the group consisting of hydrogen and compounds including hydrogen and carbon.

In the first pattern formation material, an alkyl group is bonded to carbon located at the α-position and constituting the main chain of the base polymer, and the alkyl group is never eliminated through irradiation of the exposing light of a wavelength of a 1 through 30 nm band or a 110 through 180 nm band. Therefore, a crosslinking reaction of the main chain of the base polymer is never caused in an exposed portion of the resist film.

The second pattern formation material of this invention comprises a base polymer that includes a unit represented by the following General Formula 2 and is decomposed by an acid; and an acid generator for generating an acid through irradiation of light:

General Formula 2:

wherein $R_0$ is an alkyl group; $R_2$ is a group that is decomposed by an acid; and $R_3$ and $R_4$ are the same or different and selected from the group consisting of hydrogen and compounds including hydrogen and carbon.

In the second pattern formation material, an alkyl group is bonded to carbon located at the α-position and constituting the main chain of the base polymer, and the alkyl group is never eliminated through irradiation of the exposing light of a wavelength of a 1 through 30 nm band or a 110 through 180 nm band. Therefore, the crosslinking reaction of the main chain of the base polymer is never caused in an exposed portion of the resist film.

The third pattern formation material of this invention comprises a base polymer including a first unit represented by the following General Formula 3 and a second unit represented by the following General Formula 4:

General Formula 3:

General Formula 4:

wherein $R_0$ is an alkyl group; $R_1$ is a group that is decomposed through irradiation of light; $R_3$ and $R_4$ are the same or different and selected from the group consisting of hydrogen and compounds including hydrogen and carbon; at least one of $R_5$ and $R_7$ is an alkyl group and $R_5$ or $R_7$ that is not an alkyl group is hydrogen or a compound including hydrogen and carbon; and $R_6$ and $R_8$ are the same or different and selected from the group consisting of hydrogen and compounds including hydrogen and carbon.

In the third pattern formation material, an alkyl group is bonded to carbon located at the α-position and constituting the main chain of the first unit and to at least one carbon constituting the main chain of the second unit, and the alkyl groups are never eliminated through irradiation of the exposing light of a wavelength of a 1 through 30 nm band or a 110 through 180 nm band. Therefore, the crosslinking reaction of the main chain of the base polymer is never caused in an exposed portion of the resist film.

The fourth pattern formation material of this invention comprises a base polymer including a first unit represented by the following General Formula 5 and a second unit represented by the following General Formula 6; and an acid generator for generating an acid through irradiation of light:

General Formula 5:

General Formula 6:

wherein $R_0$ is an alkyl group; $R_2$ is a group that is decomposed by an acid; $R_3$ and $R_4$ are the same or different and selected from the group consisting of hydrogen and compounds including hydrogen and carbon; at least one of $R_5$ and $R_7$ is an alkyl group and $R_5$ or $R_7$ that is not an alkyl group is hydrogen or a compound including hydrogen and carbon; and $R_6$ and $R_8$ are the same or different and selected from the group consisting of hydrogen and compounds including hydrogen and carbon.

In the fourth pattern formation material, an alkyl group is bonded to carbon located at the α-position and constituting the main chain of the first unit and to at least one carbon constituting the main chain of the second unit, and the alkyl groups are never eliminated through irradiation of the exposing light of a wavelength of a 1 through 30 nm band or a 110 through 180 nm band. Therefore, the crosslinking reaction of the main chain of the base polymer is never caused in an exposed portion of the resist film.

Accordingly, by using any of the first through fourth pattern formation materials, the solubility of an exposed portion of the resist film in an alkaline developer can be improved, so as to improve contrast between an exposed portion and an unexposed portion of the resist film, resulting in increasing resolution of the resist film.

In any of the first through fourth pattern formation materials, the base polymer is preferably an α-methylstyrene derivative.

Thus, the solubility of the base polymer in an alkaline developer can be definitely improved, so as to definitely increase the resolution of the resist film.

The first pattern formation method of this invention comprises the steps of forming a resist film from a pattern formation material including a base polymer having a unit represented by the following General Formula 7; and forming a resist pattern by irradiating the resist film with exposing light of a wavelength of a 1 through 30 nm band or a 110 through 180 nm band for pattern exposure and developing the resist film after the pattern exposure:

General Formula 7:

wherein $R_0$ is an alkyl group; $R_1$ is a group that is decomposed through irradiation of light; and $R_3$ and $R_4$ are the same or different and selected from the group consisting of hydrogen and compounds including hydrogen and carbon.

In the first pattern formation method, the aforementioned first pattern formation material is used, so that the solubility of the base polymer in an alkaline developer can be improved in an exposed portion of the resist film.

The second pattern formation method of this invention comprises the steps of forming a resist film from a pattern formation material including a base polymer that has a unit represented by the following General Formula 8 and is decomposed by an acid, and an acid generator for generating an acid through irradiation of light; and forming a resist pattern by irradiating the resist film with exposing light of a wavelength of a 1 through 30 nm band or a 110 through 180 nm band for pattern exposure and developing the resist film after the pattern exposure:

General Formula 8:

$R_0$ is an alkyl group; $R_2$ is a group that is decomposed by an acid; and $R_3$ and $R_4$ are the same or different and selected from the group consisting of hydrogen and compounds including hydrogen and carbon.

In the second pattern formation method, the aforementioned second pattern formation material is used, so that the solubility of the base polymer in an alkaline developer can be improved in an exposed portion of the resist film.

The third pattern formation method of this invention comprises the steps of forming a resist film from a pattern formation material including a base polymer having a first unit represented by the following General Formula 9 and a second unit represented by the following General Formula 10 and forming a resist pattern by irradiating the resist film with exposing light of a wavelength of a 1 through 30 nm band or a 110 through 180 nm band for pattern exposure and developing the resist film after the pattern exposure:

General Formula 9:

General Formula 10:

wherein $R_0$ is an alkyl group; $R_1$ is a group that is decomposed through irradiation of light; $R_3$ and $R_4$ are the same or different and selected from the group consisting of hydrogen and compounds including hydrogen and carbon; at least one of $R_5$ and $R_7$ is an alkyl group and $R_5$ or $R_7$ that is not an alkyl group is hydrogen or a compound including hydrogen and carbon; and $R_6$ and $R_8$ are the same or different and selected from the group consisting of hydrogen and compounds including hydrogen and carbon.

In the third pattern formation method, the aforementioned third pattern formation material is used, so that the solubility of the base polymer in an alkaline developer can be improved in an exposed portion of the resist film.

The fourth pattern formation method of this invention comprises the steps of forming a resist film from a pattern formation material including a base polymer having a first unit represented by the following General Formula 11 and a second unit represented by the following General Formula 12, and an acid generator for generating an acid through irradiation of light; and forming a resist pattern by irradiating the resist film with exposing light of a wavelength of a 1 through 30 nm band and a 110 through 180 nm band for pattern exposure and developing the resist film after the pattern exposure:

General Formula 11:

General Formula 12:

wherein $R_0$ is an alkyl group; $R_2$ is a group that is decomposed by an acid; $R_3$ and $R_4$ are the same or different and selected from the group consisting of hydrogen and compounds including hydrogen and carbon; at least one of $R_5$ and $R_7$ is an alkyl group and $R_5$ or $R_7$ that is not an alkyl group is hydrogen or a compound including hydrogen and carbon; and $R_6$ and $R_8$ are the same or different and selected from the group consisting of hydrogen and compounds including hydrogen and carbon.

In the fourth pattern formation method, the aforementioned fourth pattern formation material is used, so that the solubility of the base polymer in an alkaline developer can be improved in an exposed portion of the resist film.

Accordingly, in any of the first through fourth pattern formation methods, the solubility of the resist film in an alkaline developer can be improved in an exposed portion of the resist film, so as to improve the contrast between an exposed portion and an unexposed portion of the resist film, resulting in increasing the resolution of the resist film.

In any of the first through fourth pattern formation methods, the base polymer is preferably an α-methylstyrene derivative.

Thus, the solubility of the base polymer in an alkaline developer can be definitely improved in an exposed portion of the resist film, so as to definitely increase the resolution of the resist film.

In any of the first through fourth pattern formation methods, the exposing light is preferably $F_2$ excimer laser, $Ar_2$ excimer laser or soft X-rays

DETAILED DESCRIPTION OF THE INVENTION

EMBODIMENT 1

A pattern formation material and a pattern formation method of Embodiment 1 of the invention will now be described with reference to FIGS. 1(a) through 1(c).

Embodiment 1 corresponds to the first pattern formation material and the first pattern formation method described above, and specifically, a pattern formation material including the following base polymer is used:

Base polymer:
a polymer represented by Chemical Formula 2  2 g
Solvent: diglyme  20 g Chemical Formula 2:

In Chemical Formula 2, $R_0$ and $R_1$ respectively correspond to $R_0$ and $R_1$ of General Formula 1 or 7, and $R_3$ and $R_4$ of General Formula 1 or 7 are both hydrogen in Chemical Formula 2.

Figure 1A:
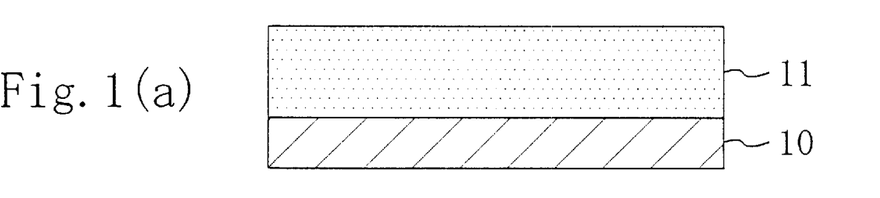
FIGS. 1(a) through 1(c) are sectional views for showing procedures in a pattern formation method of Embodiment 1 of the invention.

First, as is shown in FIG. 1(a), the resist material having the aforementioned composition is applied by spin coating on a semiconductor substrate 10, and the resultant is pre-baked, so as to form a resist film 11 with a thickness of 0.3 μm. Since the base polymer is alkali-refractory, the resist film 11 is alkali-refractory.

Figure 1B:
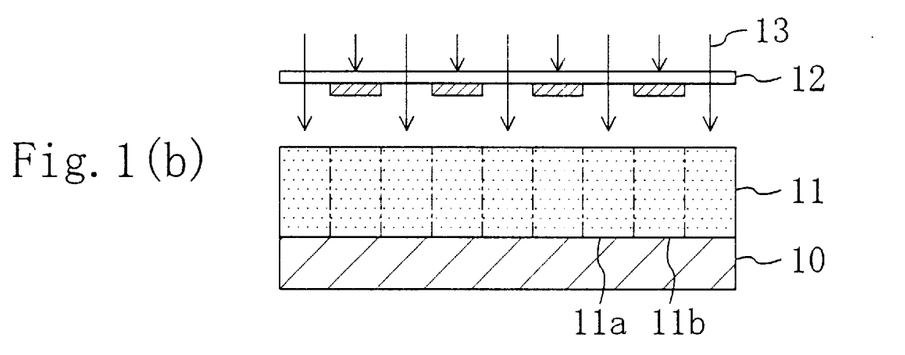
Figure 1C:
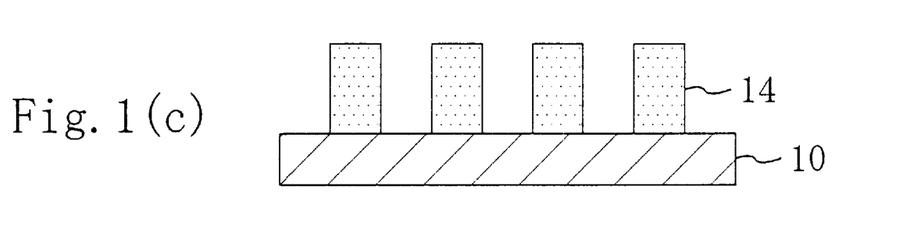

Next, as is shown in FIG. 1(b), the resist film 11 is irradiated through a mask 12 with $F_2$ excimer laser 13 for pattern exposure. Thus, since the base polymer is decomposed by the $F_2$ excimer laser 13 in an exposed portion 11a of the resist film 11, the exposed portion 11a becomes soluble in an alkaline developer while an unexposed portion 11b of the resist film 11 remains refractory in an alkaline developer.

Then, the resist film 11 is developed with an alkaline developer such as a tetramethylammonium hydroxide aqueous solution. Thus, the exposed portion 11a of the resist film 11 is dissolved in the developer, resulting in forming a resist pattern 14 from the unexposed portion 11b of the resist film 11 as is shown in FIG. 1(c).

In Embodiment 1, a methyl group is bonded to carbon located at the α-position and constituting the main chain of the base polymer, and the methyl group is never eliminated through the irradiation of the $F_2$ excimer laser 13 of a short wavelength. Accordingly, a crosslinking reaction of the main chain of the base polymer is never caused in the exposed portion 11a of the resist film 11. As a result, the solubility of the base polymer in an alkaline developer can be improved.

EMBODIMENT 2

A pattern formation material and a pattern formation method of Embodiment 2 of the invention will now be described with reference to FIGS. 2(a) through 2(d).

Embodiment 2 corresponds to the second pattern formation material and the second pattern formation method described above, and specifically, a pattern formation material including the following base polymer is used:

| | |
|---|---|
| Base polymer: | 2 g |
| a polymer represented by Chemical Formula 3 | |
| Acid generator: | 0.04 g |
| triphenylsulfonium triflate | |
| Solvent: diglyme | 20 g |

Chemical Formula 3:

In Chemical Formula 3, $R_0$ and $R_2$ respectively correspond to $R_0$ and $R_2$ of General Formula 2 or 8, and $R_3$ and $R_4$ of General Formula 2 or 8 are both hydrogen in Chemical Formula 3.

Figure 2A:
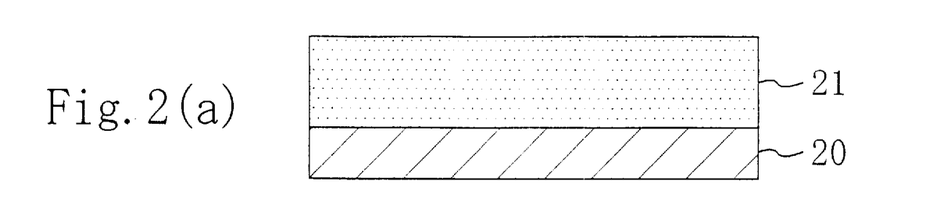
FIGS. 2(a) through 2(d) are sectional views for showing procedures in a pattern formation method of Embodiment 2 of the invention.

First, as is shown in FIG. 2(a), the resist material having the aforementioned composition is applied by spin coating on a semiconductor substrate 20, and the resultant is pre-baked, so as to form a resist film 21 with a thickness of 0.3 μm. Since the base polymer is alkali-refractory, the resist film 21 is alkali-refractory.

Figure 2B:
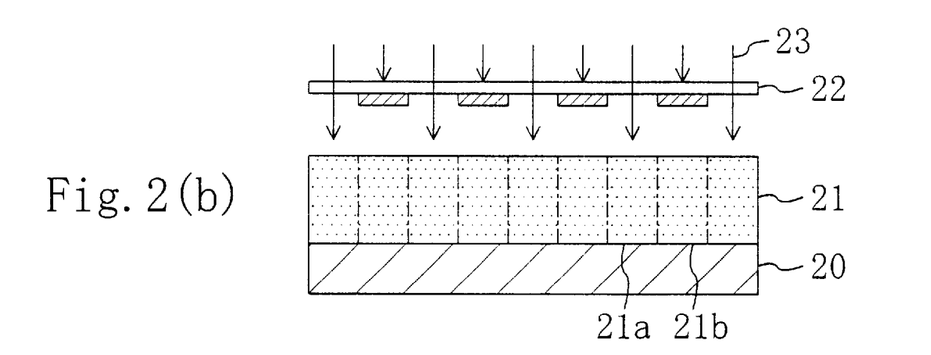

Next, as is shown in FIG. 2(b), the resist film 21 is irradiated through a mask 22 with $F_2$ excimer laser 23 for pattern exposure. Thus, an acid is generated from the acid generator in an exposed portion 21a of the resist film 21 while no acid is generated in an unexposed portion 21b of the resist film 21.

Figure 2C:
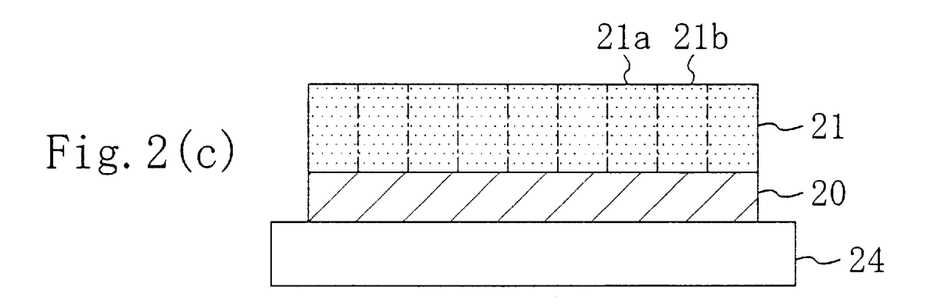

Then, as is shown in FIG. 2(c), the semiconductor substrate 20 together with the resist film 21 are heated with a hot plate 24. Thus, the exposed portion 21a of the resist film 21 becomes soluble in an alkaline developer because the acid generated from the acid generator decomposes the base polymer while the unexposed portion 21b of the resist film 21 remains refractory in an alkaline developer.

Figure 2D:
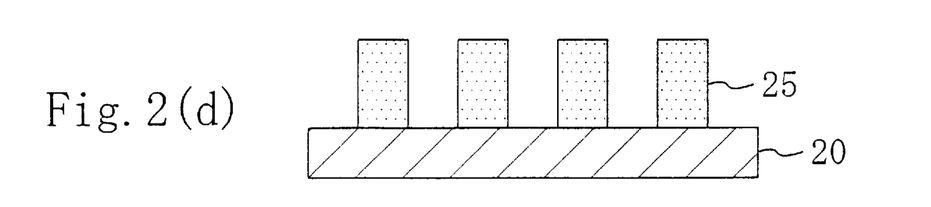

Subsequently, the resist film 21 is developed with an alkaline developer such as a tetramethylammonium hydroxide aqueous solution. Thus, the exposed portion 21a of the resist film 21 is dissolved in the developer, resulting in forming a resist pattern 25 from the unexposed portion 21b of the resist film 21 as is shown in FIG. 2(d).

In Embodiment 2, a methyl group is bonded to carbon located at the α-position and constituting the main chain of the base polymer, and the methyl group is never eliminated through the irradiation of the $F_2$ excimer laser 23 of a short wavelength and the generation of the acid from the acid generator. Accordingly, the crosslinking reaction of the main chain of the base polymer is never caused in the exposed portion 21a of the resist film 21. Accordingly, the solubility of the base polymer in an alkaline developer can be improved.

In Embodiments 1 and 2, $R_0$ of General Formula 1, 7, 2 or 8 is a methyl group, but the same effect can be attained by replacing the methyl group with another alkyl group such as an ethyl group.

Also, $R_1$ of General Formula 1, or 7 can be any group having at least one of an alkyl group, a carboxyl group, a carboxylic ester group, acetal, a group having an aliphatic ring, a group having an aromatic ring and a group having a hetero ring.

Furthermore, $R_2$ of General Formula 2 or 8 can be any group having at least one of an alkyl group, a carboxyl group, a carboxylic ester group, acetal, a group having an aliphatic ring, a group having an aromatic ring and a group having a hetero ring, and examples are those represented by Chemical Formulas 4 and 5:

Chemical Formula 4:

Chemical Formula 5:

Moreover, $R_3$ and $R_4$ of General Formula 1, 7, 2 or 8 are not herein specified, and can be widely selected from hydrogen and compounds including hydrogen and carbon. Examples are an alkyl group such as a methyl group and an ethyl group, and a cyano group.

EMBODIMENT 3

A pattern formation material and a pattern formation method of Embodiment 3 of the invention will now be described. Embodiment 3 corresponds to the third pattern formation material and the third pattern formation method described above, and is different from Embodiment 1 in the pattern formation material alone, and hence, the pattern formation material alone will be herein described.

| | |
|---|---|
| Base polymer: | 2 g |
| a polymer represented by Chemical Formula 6 | |
| Solvent: diglyme | 20 g |

Chemical Formula 6:

In Chemical Formula 6, $R_0$ and $R_1$ respectively correspond to $R_0$ and $R_1$ of General Formula 3 or 9, and $R_3$ and $R_4$ of General Formula 3 or 9 are both hydrogen in Chemical Formula 6. $R_5$ and $R_6$ of Chemical Formula 6 respectively correspond to $R_5$ and $R_6$ of General Formula 4 or 10, and $R_7$ and $R_8$ of General Formula 4 or 10 are both hydrogen in Chemical Formula 6.

In Embodiment 3, a methyl group is bonded to carbon located at the α-position and constituting the main chain of a first unit, and a methyl group is also bonded to carbon constituting the main chain of a second unit. Both the methyl groups are never eliminated through the irradiation of the $F_2$ excimer laser of a short wavelength, and hence, the crosslinking reaction of the main chain of the base polymer is never caused in an exposed portion of the resist film. Accordingly, the solubility of the exposed portion of the resist film in a developer can be improved in Embodiment 3.

EMBODIMENT 4

A pattern formation material and a pattern formation method of Embodiment 4 of the invention will now be described. Embodiment 4 corresponds to the fourth pattern formation material and the fourth pattern formation method described above, and is different from Embodiment 2 in the pattern formation material alone, and hence, the pattern formation material alone will be herein described.

| | |
|---|---|
| Base polymer: | 2 g |
| a polymer represented by Chemical Formula 7 | |
| Acid generator: | 0.04 g |
| triphenylsulfonium triflate | |
| Solvent: diglyme | 20 g |

Chemical Formula 7:

Chemical Formula 8:

Chemical Formula 9:

In Chemical Formula 7, $R_0$ and $R_2$ respectively correspond to $R_0$ and $R_2$ of General Formula 5 or 11, and $R_3$ and $R_4$ of General Formula 5 or 11 are both hydrogen in Chemical Formula 7. $R_5$ and $R_6$ of Chemical Formula 7 respectively correspond to $R_5$ and $R_6$ of General Formula 6 or 12, and $R_7$ and $R_8$ of General Formula 6 or 12 are both hydrogen in Chemical Formula 7.

In Embodiment 4, a methyl group is bonded to carbon located at the α-position and constituting the main chain of a first unit, and a methyl group is also bonded to carbon constituting the main chain of a second unit. Both the methyl groups are never eliminated through the irradiation of the $F_2$ excimer laser of a short wavelength and the generation of the acid from the acid generator, and hence, the crosslinking reaction of the main chain of the base polymer is never caused in an exposed portion of the resist film. Accordingly, the solubility of the exposed portion of the resist film in a developer can be improved in Embodiment 4.

In Embodiments 3 and 4, $R_0$ of General Formula 3, 9, 5 or 11 is a methyl group, but the same effect can be attained by replacing the methyl group with another alkyl group such as an ethyl group.

Also, $R_1$ of General Formula 3, or 9 can be any group having at least one of an alkyl group, a carboxyl group, a carboxylic ester group, acetal, a group having an aliphatic ring, a group having an aromatic ring and a group having a hetero ring.

Furthermore, $R_2$ of General Formula 5 or 11 can be any group having at least one of an alkyl group, a carboxyl group, a carboxylic ester group, acetal, a group having an aliphatic ring, a group having an aromatic ring and a group having a hetero ring, and examples are those represented by Chemical Formulas 8 and 9:

Moreover, $R_3$ and $R_4$ of General Formula 3, 9, 5 or 11 and $R_7$ and $R_8$ of General Formula 4, 10, 6 or 12 are not herein specified, and can be widely selected from hydrogen and compounds including hydrogen and carbon. Examples are an alkyl group such as a methyl group and an ethyl group, and a cyano group.

What is claimed is:

1. A pattern formation method comprising the steps of:

forming a resist film from a pattern formation material including a base polymer having a unit represented by the following General Formula 7; and forming a resist pattern by irradiating said resist film with exposing light of a wavelength of a 1 through 30 nm band or a 110 through 180 nm band for pattern exposure and developing said resist film after the pattern exposure wherein said base polymer is an α-methylstyrene derivative:

General Formula 7:

wherein $R_0$ is an alkyl group; $R_1$ is a group that is decomposed through irradiation of light; and $R_3$ and $R_4$ are the same or different and selected from the group consisting of hydrogen and compounds including hydrogen and carbon.

2. The pattern formation method of claim 1, wherein said exposing light is an $Xe_2$ laser beam, a $F_2$ laser beam, a $Kr_2$ laser beam, and ArKr laser beam or an $Ar_2$ laser beam.

3. The pattern formation method of claim 1, wherein said exposing light is a soft X-ray beam.

4. The pattern formation: method of claim 1, wherein a terminal group of the $R_1$ is a tertiary alkyl group and $R_1$ has a carboxyl group bonded to main chain.

5. The pattern formation method of claim 1, wherein $R_1$ is selected from the group consisting of at least one of :an alkyl group, a carbonyl group, a carboxylic ester group, acetal, a group having an aliphatic ring, a group having an aromatic ring and a group having a hetero ring.

6. The pattern formation method of claim 1, wherein $R_1$ is

7. The pattern formation method of claim 1, wherein $R_1$ is $R_0$ is a methyl group, and $R_3$ and $R_4$ are hydrogen.

8. The pattern formation method of claim 1, wherein $R_3$ and $R_4$ are hydrogen.

9. A pattern formation method comprising the steps of:

forming a resist film from a pattern formation material including a base polymer that has a unit represented by the following General Formula 8 and is decomposed by an acid, and an acid generator for generating an acid through irradiation of light; and forming a resist pattern by irradiating said resist film with exposing light selected from a group consisting of $F_2$ laser beam, $Kr_2$ laser beam, ArKr laser beam and $Ar_2$ laser beam and developing said resist film after the pattern exposure:

General Formula 8:

wherein $R_0$ is an alkyl group; $R_2$ is a group that is decomposed by an acid; and $R_3$ and $R_4$ are the same or different and selected from the group consisting of hydrogen and compounds including hydrogen and carbon.

10. The pattern formation method of claim 9, wherein said base polymer is an α-methylstyrene derivative.

11. The pattern formation method of claim 9, wherein a terminal group of the $R_2$ is a tertiary alkyl group and $R_2$ has a carboxyl group bonded to main chain.

12. The pattern formation method of claim 9, wherein $R_2$ is selected from the group consisting of at least one of an alkyl group, a carbonyl group, a carboxylic ester group, acetal, a group having an aliphatic ring, a group having an aromatic ring and a group having a hetero ring.

13. The pattern formation method of claim 9, wherein $R_2$ is

14. The pattern formation method of claim 9, wherein $R_2$ is

15. The pattern formation method of claim 9, wherein $R_3$ and $R_4$ are hydrogen.

16. The pattern formation method of claim 9, wherein $R_0$ is a methyl group, $R_2$ is and $R_3$ and $R_4$ are hydrogen.

17. A pattern formation comprising the steps of:

forming a resist film from a pattern formation material including a base polymer having a first unit represented by the following General Formula 9 and a second unit represented by the following General Formula 10; and forming a resist pattern by irradiating said resist film with exposing light of a wavelength of a 1 through 30 nm band or a 110 through 180 nm band for pattern exposure and developing said resist film after the pattern exposure wherein said based polymer is an α-methylstyrene derivative:

General Formula 9:

General Formula 10:

wherein $R_0$ is an alkyl group; $R_1$ is a group that is decomposed through irradiation of light; and $R_3$ and $R_4$ are the same or different and selected from the group consisting of hydrogen and compounds including hydrogen and carbon; at least one of $R_5$ and $R_7$ is an alkyl group and $R_5$ and $R_7$ that is not an alkyl group is hydrogen or a compound including hydrogen and carbon; and $R_6$ and $R_8$ are the same or different and selected from the group consisting of hydrogen and compounds including hydrogen and carbon.

18. The pattern formation method of claim 17, wherein said exposing light is an $Xe_2$ laser beam, a $F_2$ laser beam, a $Kr_2$ laser beam, an ArKr laser beam or an $Ar_2$ laser beam.

19. The pattern formation method of claim 17, wherein said exposing light is a soft X-ray beam.

20. The pattern formation method of claim 17, wherein a terminal group of the $R_1$ is a tertiary alkyl group and $R_1$ has a carboxyl group bonded to main chain.

21. The pattern formation method of claim 17, wherein $R_1$ is selected from the group consisting of at least one of an alkyl group, a carbonyl group, a carboxylic ester group, acetal, a group having an aliphatic ring, a group having an aromatic ring and a group having a hetero ring.

22. The pattern formation method of claim 17, wherein $R_1$ is

23. The pattern formation method of claim 22, wherein $R_0$ is a methyl group, $R_3$ and $R_4$ are hydrogen, $R_5$ is a methyl group, $R_6$ is a carboxyl group, and $R_7$ and $R_8$ are hydrogen.

24. The pattern formation method of claim 17, wherein $R_3$ and $R_4$ are hydrogen.

25. The pattern formation method of claim 17, wherein $R_5$ is a methyl group.

26. The pattern formation method of claim 17, wherein $R_6$ is a carboxyl group.

27. The pattern formation method of claim 17, wherein $R_7$ and $R_8$ are hydrogen.

28. A pattern formation comprising the steps of:

forming a resist film from a pattern formation material including a base polymer having a first unit represented by the following General Formula 11 and a second unit represented by the following General Formula 12, and an acid generator for generating an acid through irradiation of light; and forming a resist pattern by irradiating said resist film with exposing light selected from a group consisting of $F_2$ laser beam, $Kr_2$ laser beam, ArKr laser beam and $Ar_2$ laser beam and developing said resist film after the pattern exposure:

General Formula 11:

General Formula 12:

wherein $R_0$ is an alkyl group; $R_2$ is a group that is decomposed by an acid; $R_3$ and $R_4$ are the same or different and selected from the group consisting of hydrogen and compounds including hydrogen and carbon; at least one of $R_5$ and $R_7$ is an alkyl group and $R_5$ and $R_7$ that is not an alkyl group is hydrogen or a compound including hydrogen and carbon; and $R_6$ and $R_8$ are the same or different and selected from the group consisting of hydrogen and compounds including hydrogen and carbon.

29. The pattern formation method of claim 28, wherein said base polymer is an α-methylstyrene derivative.

30. The pattern formation method of claim 28, wherein a terminal group of the $R_2$ is a tertiary alkyl group and $R_2$ has a carboxyl group bonded to main chain.

31. The pattern formation method of claim 28, wherein $R_2$ is selected from the group consisting of at least one of an alkyl group, a carbonyl group, a carboxylic ester group, acetal, a group having an aliphatic ring, a group having an aromatic ring and a group having a hetero ring.

32. The pattern formation method of claim 28, wherein $R_2$ is

33. The pattern formation method of claim 28, wherein $R_2$ is

34. The pattern formation method of claim 28, wherein $R_3$ and $R_4$ are hydrogen.

35. The pattern formation method of claim 28, wherein $R_3$ is a methyl group.

36. The pattern formation method of claim 28, wherein $R_6$ is

17

37. The pattern formation method of claim 28, wherein $R_0$ is a methyl group, $R_2$ is

18

$R_3$ and $R_4$ are hydrogen, $R_5$ is a methyl group, $R_6$ is $R_7$ and $R_8$ are hydrogen.

* * * * *

UNITED STATES PATENT AND TRADEMARK OFFICE
CERTIFICATE OF CORRECTION

PATENT NO.   : 6,531,259 B1
DATED        : March 11, 2003
INVENTOR(S)  : Shinji Kishimura et al.

It is certified that error appears in the above-identified patent and that said Letters Patent is hereby corrected as shown below:

Column 12,
Line 63, after "formation" delete ":"
Line 67, remove ":" before -- an --

Signed and Sealed this

Nineteenth Day of August, 2003

JAMES E. ROGAN
*Director of the United States Patent and Trademark Office*